(12) United States Patent
Suzuki et al.

(10) Patent No.: US 6,717,256 B1
(45) Date of Patent: Apr. 6, 2004

(54) MOUNTING STRUCTURE FOR SEMICONDUCTOR DEVICE HAVING ENTIRELY FLAT LEADS

(75) Inventors: Shinichi Suzuki, Kyoto (JP); Nobuaki Suzuki, Kyoto (JP); Masashi Sano, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/763,573

(22) PCT Filed: Aug. 26, 1999

(86) PCT No.: PCT/JP99/04624

§ 371 (c)(1),
(2), (4) Date: Feb. 26, 2001

(87) PCT Pub. No.: WO00/13273

PCT Pub. Date: Mar. 9, 2000

(30) Foreign Application Priority Data

Aug. 31, 1998 (JP) .......................................... 10-246025

(51) Int. Cl.[7] .............................................. H01L 23/52
(52) U.S. Cl. .......................... 257/691; 257/99; 257/100; 257/666
(58) Field of Search .......................... 257/99, 100, 666, 257/661, 777

(56) References Cited

U.S. PATENT DOCUMENTS

| 5,198,888 A | * | 3/1993 | Sugano et al. ............... 257/685 |
| 5,495,125 A | * | 2/1996 | Uemura ....................... 257/662 |

FOREIGN PATENT DOCUMENTS

| JP | 48-93284 | 12/1973 | |
| JP | 59-195757 | 12/1984 | .......... H01L/33/00 |
| JP | 62-131441 | 8/1987 | .......... H01L/21/68 |
| JP | 63-168931 | 11/1988 | .......... H01H/13/02 |
| JP | 63-173721 | 11/1988 | .......... G11B/7/12 |
| JP | 01-120875 | 5/1989 | .......... H01L/31/12 |
| JP | 2-101559 | 8/1990 | .......... H01L/33/00 |
| JP | 4-5652 | 1/1992 | .......... H01L/23/48 |
| JP | 05-319403 | 12/1993 | .......... B56B/11/52 |
| JP | 06-296045 | 10/1994 | .......... H01L/33/00 |
| JP | 08-032106 | 2/1996 | .......... H01L/31/12 |

OTHER PUBLICATIONS

English language Abstract of Japanese Pat.Pub.Nos. 06–296045 dated Oct. 21, 1994, 08–032106 dated Feb. 2, 1996, 05–319403 dated Dec. 3, 1993, and 01–120875 dated May 12, 1989.

Copy of English Translation of International Search Report;.
Copy of International Preliminary Examining Report.

* cited by examiner

*Primary Examiner*—Nathan J. Flynn
*Assistant Examiner*—Leonardo Andújar
(74) *Attorney, Agent, or Firm*—Michael D. Bednarek; Shaw Pittman LLP

(57) ABSTRACT

The semiconductor device (A) comprises a semiconductor chip (3), a protective package (4) covering the semiconductor chip (3), a first lead (1), and a second lead (2). The semiconductor chip (3) is placed at an inner end (10a) of the first lead (1). Further, the semiconductor chip (3) is connected to an inner end (20a) of the second lead (2) via a wire (W). The first lead (1) includes an outer portion (11) extending out of the protective package (4) whereas the second lead (2) includes an outer portion (21) extending out of the protective package (4). These two outer portions (11, 21) are flat.

3 Claims, 17 Drawing Sheets

MOUNTING STRUCTURE FOR SEMICONDUCTOR DEVICE HAVING ENTIRELY FLAT LEADS

TECHNICAL FIELD

The present invention relates to a semiconductor device, and more specifically to a semiconductor device having a light emitting capability and/or a light receiving capability. Further, the present invention relates to a circuit substrate for supporting such a semiconductor device as the above. Still further, the present invention relates to a combination of the semiconductor device and a storage receptacle for collectively holding a plurality of the semiconductor devices.

BACKGROUND ART

FIG. 20 and FIG. 21 show a prior art semiconductor device. This semiconductor device X is a light emitting diode (LED), and includes a first lead 100, a second lead 200, a semiconductor chip 300 as a light emitting element, a connecting wire W, and a protective package 400.

The semiconductor chip 300 is placed at an inner end 100a of the first lead 100. The semiconductor chip 300 has an upper surface 330 electrically connected with an inner end 200a of the second lead 200 via a wire W. The protective package 400 is made of a transparent resin such as an epoxy resin, and completely covers the semiconductor chip 300 and the connecting wire W. Further, the protective package 400 partially covers the first and the second leads 100, 200. In FIGS. 20 and 21, the inner portion of the first lead 100 covered by the protective package 400 is indicated by numeral code 110 whereas the outer portion of the first lead 100 extending out of the protective package 400 is indicated by numeral code 111. Like the first lead 100, the second lead 200 also has an inner portion 220 covered by the protective package 400 and an outer portion 221 extending out of the protective package 400.

As shown in FIG. 21, the inner portion 110 of the first lead 100 extends straightly whereas the outer portion 111 is bent. The outer portion 111 of the first lead 100 has a free end 111a flush with a bottom surface of the protective package 400. The second lead also has the same constitution as the first lead, and thus has a free end 221a flush with the bottom surface of the protective package 400.

The circuit substrate 5 is provided with pads 52a, 52b for establishing electrical connection with the semiconductor device X. The semiconductor device X is mounted on the circuit substrate 5, with the free ends 111a, 221a connected with the pads 52a 52b respectively.

The prior art semiconductor device X is inconvenient in the following points: Specifically, the semiconductor device X is mounted on the circuit substrate 5 via the leads 100, 200 which are bent as described above. In such a case, as shown in FIG. 21, the entire protective package 400 of the semiconductor device X comes above the circuit substrate 5. This leads to a problem that a dimension Dh between a top Ap of the semiconductor device X and an upper surface of the circuit substrate 5 becomes large.

DISCLOSURE OF THE INVENTION

It is therefore an object of the present invention to provide a semiconductor device capable of solving or at least reduce the problem described above.

Another object of the present invention is to provide a circuit substrate for mounting such a semiconductor device as the above.

Still another object of the present invention is to provide a combination of a plurality of the semiconductor devices and a storage receptacle for collectively holding these semiconductor devices.

According to a first aspect of the present invention, there is provided a semiconductor device comprising: a semiconductor chip; a protective package covering the semiconductor chip; a first lead conducting to the semiconductor chip, including an inner portion covered by the protective package and at least one outer portion extending out of the protective package; a second lead conducting to the semiconductor chip, including an inner portion covered by the protective package and at least one outer portion extending out of the protective package; wherein each of the outer portions of the first lead and the second lead is flat.

Preferably, the outer portion of the first lead and the outer portion of the second lead extend in a same plane.

Further, the inner portion and the outer portion of the first lead, and the inner portion and the outer portion of the second lead may extend in a same plane.

According to a preferred embodiment of the present invention, each of the first lead and the second lead has a plurality of outer portions extending out of the protective package, and the outer portions extend in a same plane.

Preferably, the protective package includes at least a pair of opposed side surfaces, and each of the side surfaces has a first slanted portion and a second slanted portion.

The first slanted portion and the second slanted portion may be flat and meet with each other at a predetermined angle.

The semiconductor chip is a light emitting element for example. Also, the semiconductor chip is a light receiving element for example.

According to another preferred embodiment of the present invention, the semiconductor device further comprises an additional semiconductor chip, a third lead conducting to the additional semiconductor chip, and a fourth lead conducting to the additional semiconductor chip. The third lead includes an inner portion covered by the protective package and a flat outer portion extending out of the protective package, and the fourth lead includes an inner portion covered by the protective package and a flat outer portion extending out of the protective package.

According to a second aspect of the present invention, there is provided a circuit substrate for mounting a semiconductor device including a protective package and flat leads extending out of the protective package. The substrate comprises: a main surface formed with a predetermined wiring pattern; a plurality of connecting pads formed in the main surface for conduction to the leads of the semiconductor device; and a through hole corresponding to a shape of the protective package.

Preferably, the connecting pads are disposed around the through hole.

Preferably, the main surface mounted with the semiconductor device is laminated with a coating member.

According to a third aspect of the present invention, a combination of a plurality of semiconductor devices and a storage receptacle for storing the same is provided: each of these semiconductor devices includes an upper surface having a predetermined function, and a bottom surface away from the upper surface, whereas the storage receptacle includes a carrier member having a plurality of recesses opening upward, and a covering tape having an adhesive surface attached to the carrier member, and the semiconductor device is housed in the recess with the bottom surface facing upward.

According to a preferred embodiment of the present invention, the upper surface of the semiconductor device is formed with a light-condensing portion.

Preferably, each of the recesses includes a larger space and a smaller space.

Preferably, the recesses are formed longitudinally of the carrier member at a predetermined interval.

Other objects, characteristics, and advantages of the present invention will become clearer from the following description of embodiments to be presented with reference to the accompanying drawings.

BEST MODE FOR CARRYING OUT THE INVENTION

Now, preferred embodiments of the present invention will be described with reference to the accompanying drawings, FIGS. 1–19.

Figure 1:
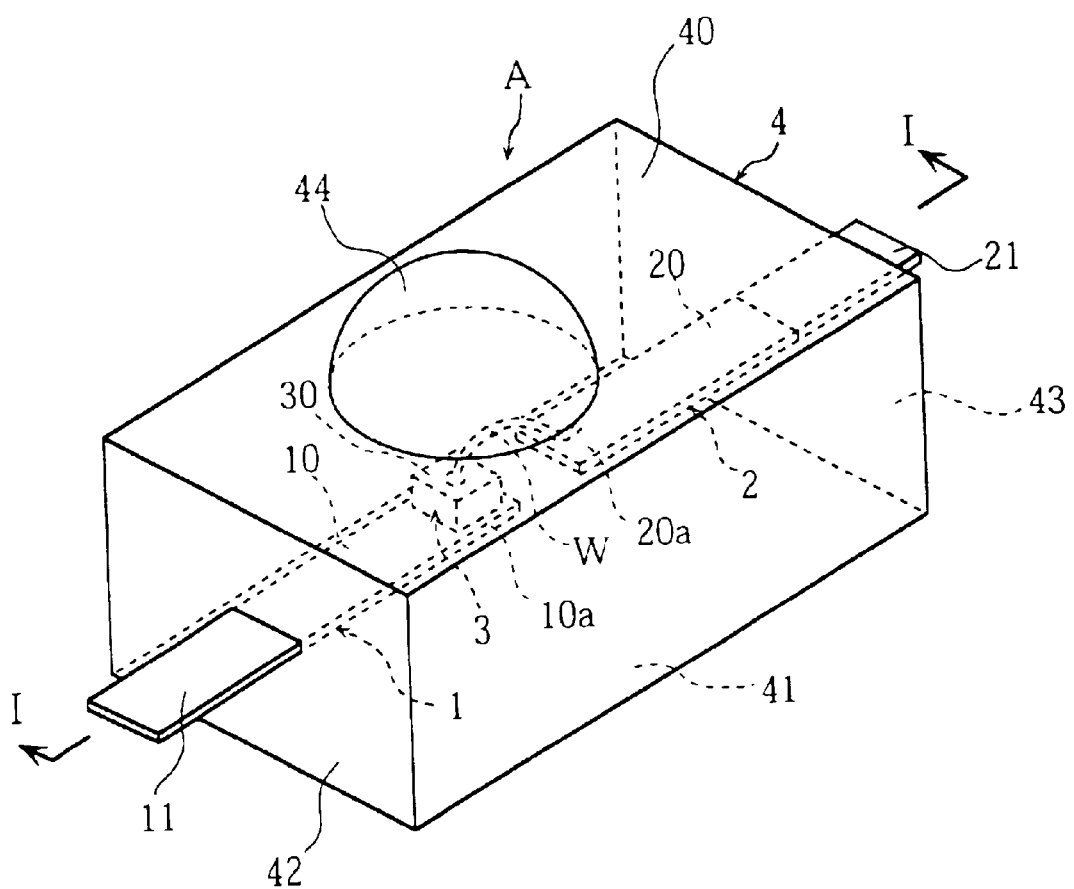
FIG. 1 is a perspective view of a semiconductor device as a first embodiment of the present invention.
Figure 2:
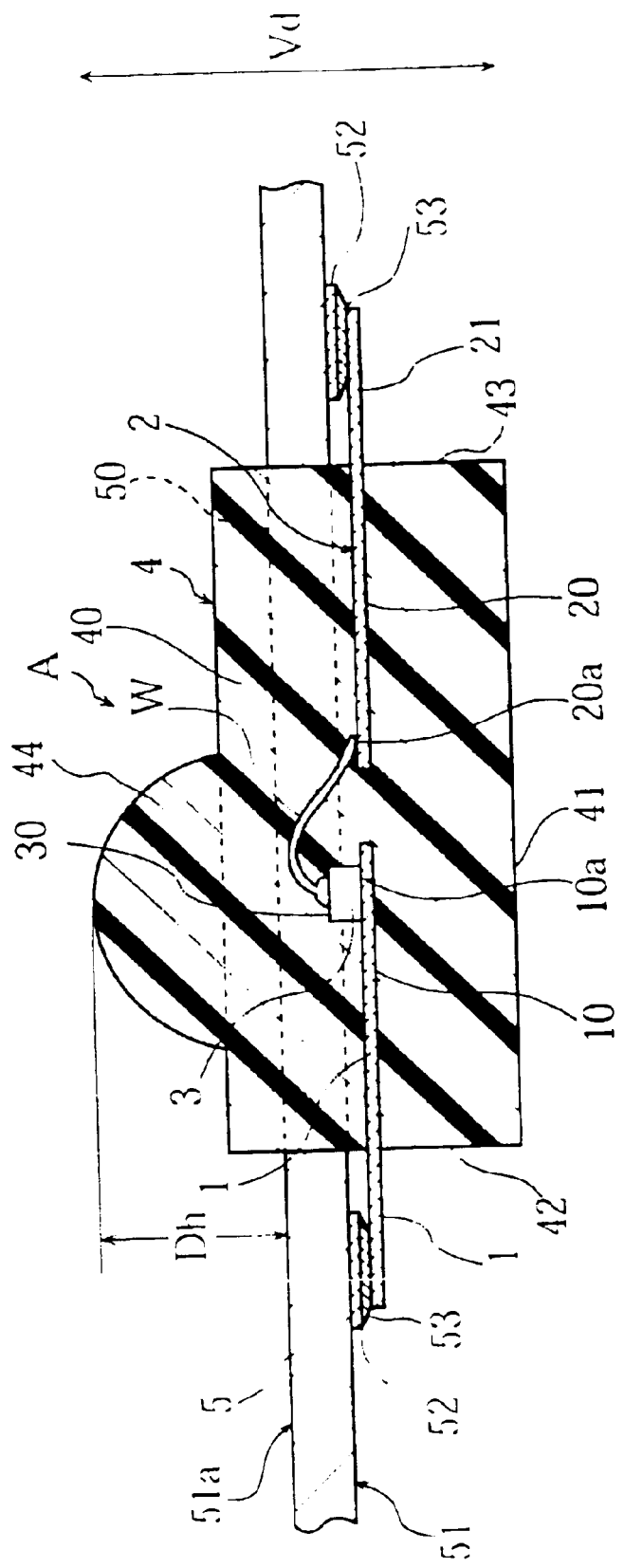
FIG. 2 is a sectional view taken in lines I—I in FIG. 1.

First, reference is made to FIGS. 1 and 2. These figures show a semiconductor device according to a first embodiment of the present invention. This semiconductor device A according to the present embodiment has a light emitting capability as will be described later. However, the present invention is not limited to this embodiment, and can be applicable to other semiconductor devices.

As shown in FIGS. 1 and 2, the semiconductor device A comprises a first lead 1, a second lead 2 spaced from the first lead 1, and a semiconductor chip 3 having a light emitting capability. The semiconductor chip 3 is supported on an end 10a of the first lead 1, and has an upper surface 30 electrically connected with an end 20a of the second lead 2 via a wire W.

The semiconductor device A further comprises a protective package 4 made of a transparent resin. The protective package 4 includes a main body portion 40 which is generally rectangular parallelepiped, and a light condensing portion 44 formed on an upper surface of the main body portion. The light condensing portion 44 is provided so as to prevent diffusion of light emitted by the semiconductor chip 3.

The protective package 4 entirely covers the semiconductor chip 3 and the wire W, and partially covers the first lead 1 and the second lead 2. With this constitution, the first lead 1 includes an inner portion 10 covered by the protective package 4 and an outer portion 11 extending out of a first side surface 42 of the protective package 4. Likewise, the second lead 2 also includes an inner portion 20 covered by the protective package 4 and an outer portion 21 extending out of the second side surface 43 of the protective package 4.

As shown in FIGS. 1 and 2, the first lead 1 and the second lead 2 are flat as a whole. Therefore, the outer portions 11, 21 of the first lead 1 and the second lead 2 are also flat. As clearly shown in FIG. 2, in a vertical relationship (i.e. directions indicated by reference code Vd), the first lead 1 and the second lead 2 are located at a center of the main body portion 40 of the protective package 4. Further, the first lead 1 and the second lead 2 extend in parallel to a bottom surface 41 of the protective package 4. Therefore, the outer portion 11 of the first lead 1 is vertical to the first side surface 42 of the protective package 4 whereas the outer portion 21 of the second lead 2 is vertical to the second side surface 43 of the protective package 4.

The semiconductor device A with the constitution described above is mounted on the circuit substrate as shown in FIG. 2. Specifically, the circuit substrate 5, has a main surface 51 (a lower surface in FIG. 2) provided with connecting pads 52 at locations corresponding to the outer portion of the first lead 1 and the outer portion 21 of the second lead 2. Though not illustrated, the main surface 51 is formed with a predetermined wiring pattern connecting with these connecting pads 52. Further, the circuit substrate 5 is provided with a through hole 50 between the connecting pads 52 for fitting the semiconductor device A.

The semiconductor device A is fitted into the through hole 50, with the light condensing portion 44 facing away from the main surface 51 of the circuit substrate 5. The outer portion 11 and 21 of the first lead 1 and the second lead 2 are connected to respective connecting pads 52 via solder 53. According to the mounting method described as above, the distance Dh between the top of the light condensing portion 44 and a second surface 51a of the substrate 5 can be made smaller than in the prior art.

Figure 3:
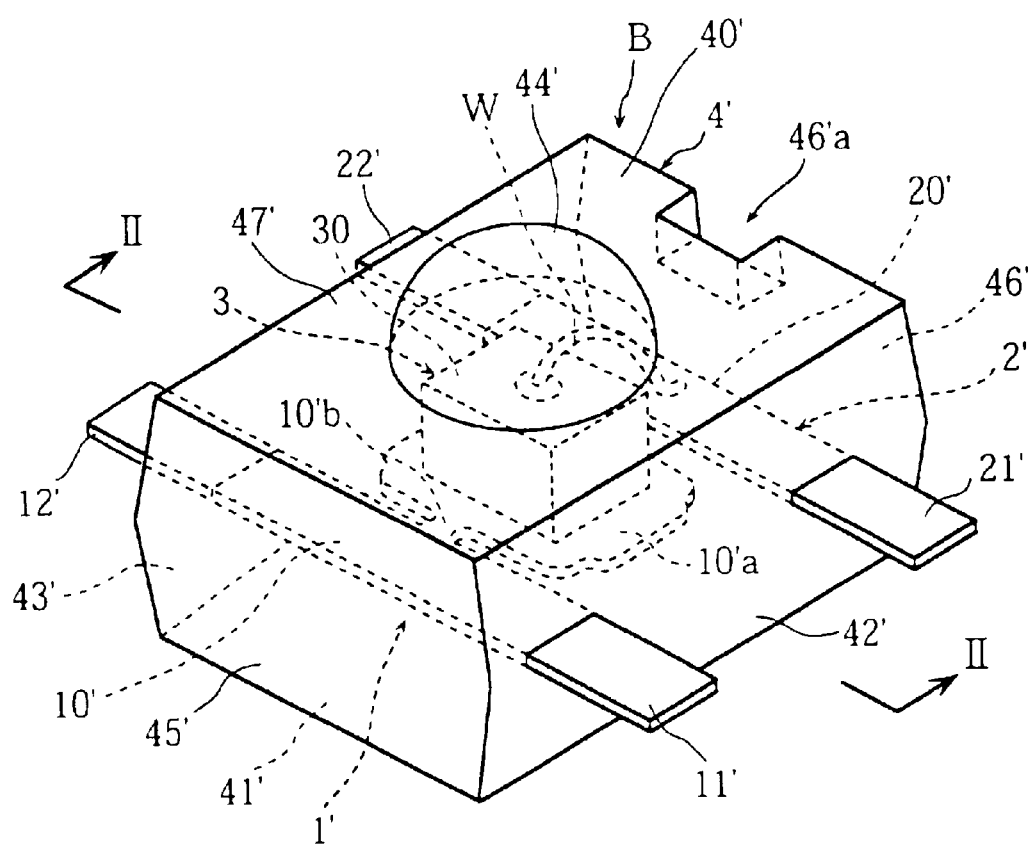
FIG. 3 is a perspective view of a semiconductor device as a second embodiment of the present invention.
Figure 4:
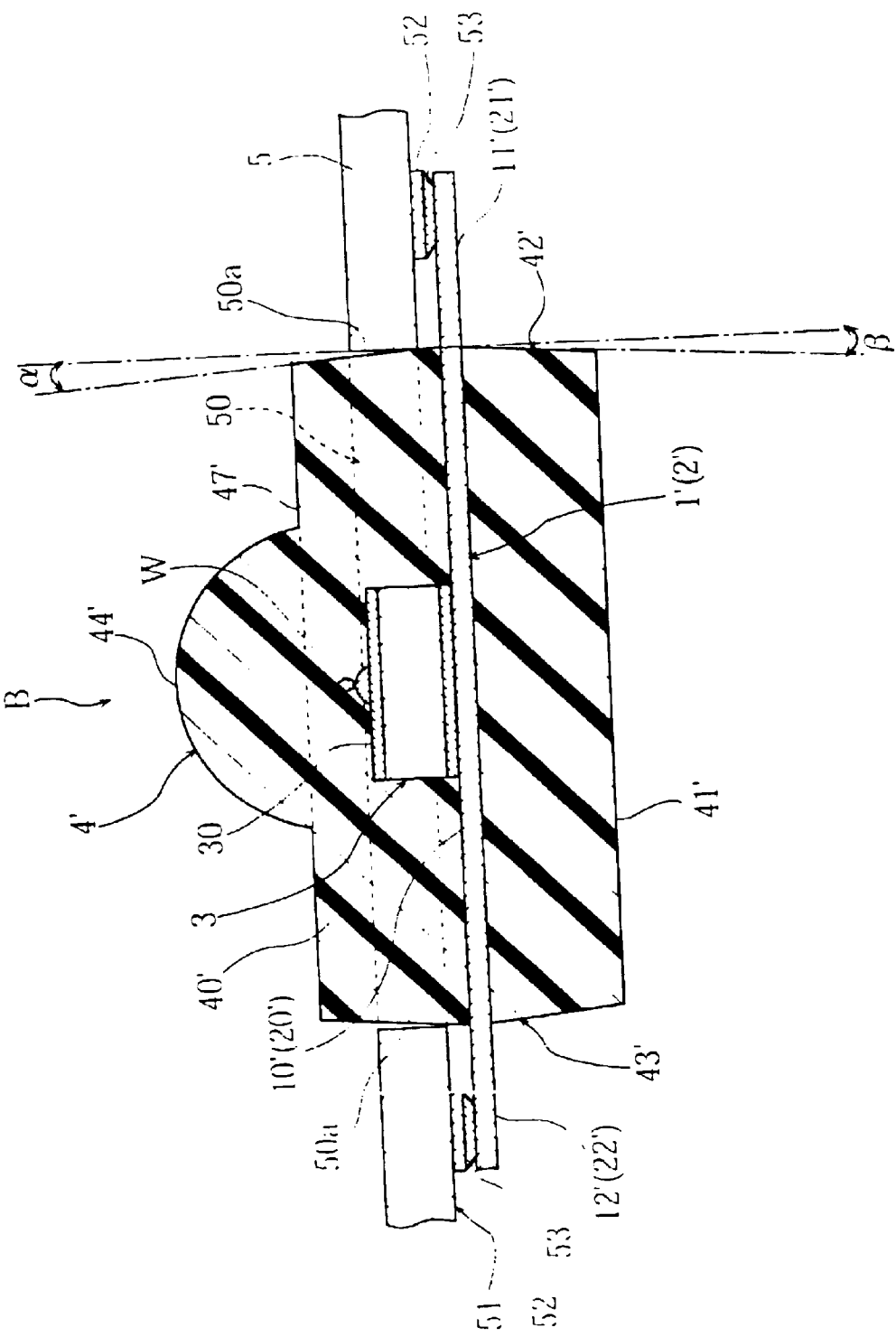
FIG. 4 is a sectional view taken in lines II—II in FIG. 3.
Figure 5:
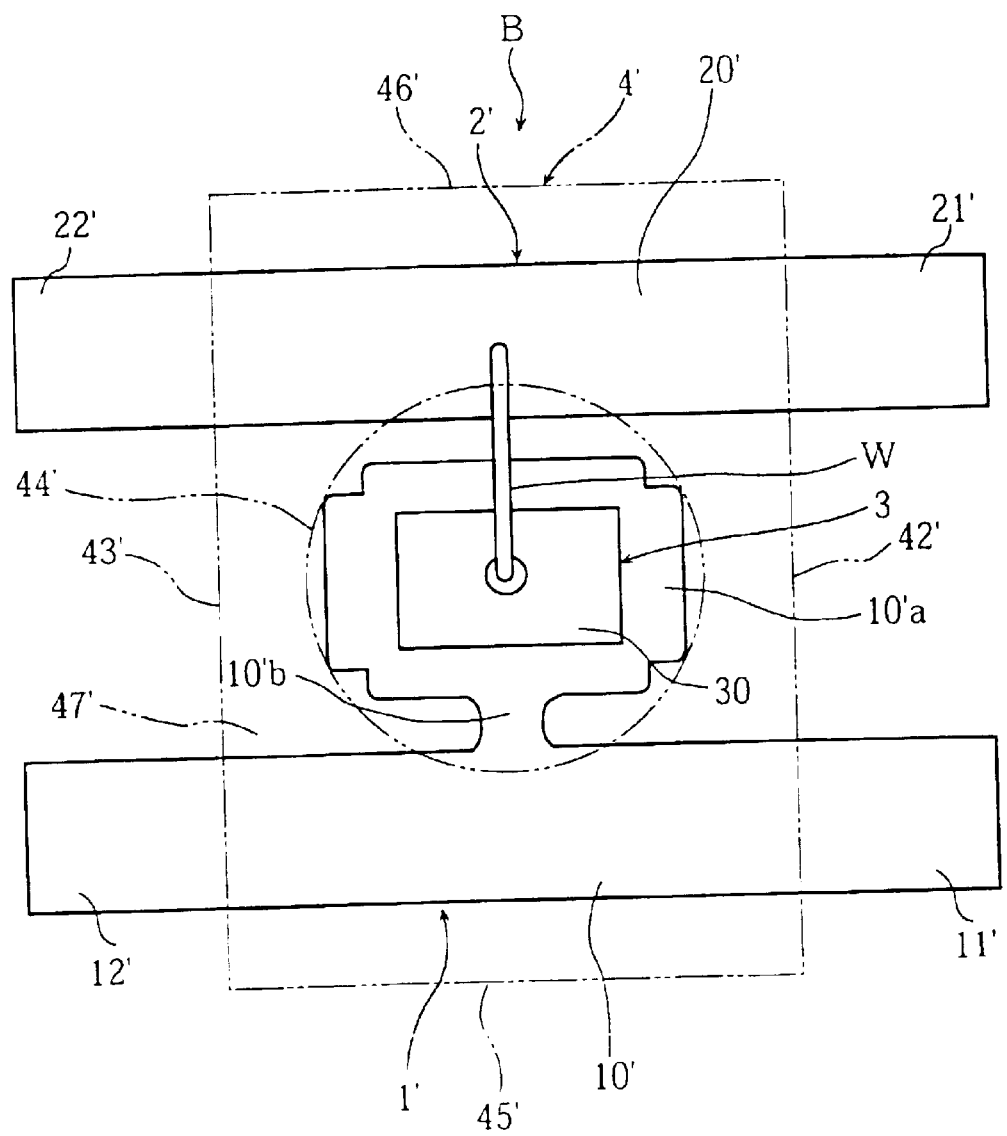
FIG. 5 is a plan view of the semiconductor device in FIG. 3.

Reference is now made to FIGS. 3–5. These figures show a semiconductor device B according to a second embodiment of the present invention. It should be noted here that components substantially the same as in the first embodiment are indicated by the same reference codes in FIGS. 3–5.

As shown in FIG. 3, the semiconductor device B has a first lead 1' to which the semiconductor chip 3 is bonded, and the second lead 2'. The semiconductor chip 3 is connected to the second lead 2' via a wire W. The semiconductor device B further has a protective package 4' for protecting the semiconductor chip 3 and the wire W. The protective package 4' has an opposed pair of side surfaces 42' and 43' (hereinafter called the first side surface 42' and the second side surface 43'), out of which the first lead 1' and the second lead 2' extend respectively. The protective package 41 has another opposed pair of side surfaces 45' and 46'. The protective package 4' further has a light condensing portion 44' for appropriately condensing light emitted by the semiconductor chip 3.

As shown in FIG. 4, each of the first side surface 42' and the second side surface 43' of the protective package 4' includes two slanted surfaces. Specifically, the first side surface 42' includes an upper slanted surface slanted at an angle of α with respect to the vertical line, and a lower slanted surface slanted at an angle of β to the same vertical line. Likewise, the second side surface 43' and other side surfaces 45', 46' include an upper slanted surface and a lower slanted surface respectively. The angles α and β may be 5–10 degrees for example. The angles α and β may be the same or may be different from each other.

As shown in FIG. 5, the first lead 1' includes an inner portion 10' covered by the protective package 4' and a first outer portion 11' and a second outer portion 12' each extending out of the protective package 4'. The inner portion 10' and the two outer portions 11', 12' extend in a plane parallel to a bottom surface 41' of the protective package 4'. Further, the first lead 1' has a supporting pad 10' a to be mounted with a semiconductor chip 3. The supporting pads 10'a is located between the first lead 1' and the second lead 2', being connected to the inner portion 10' of the first lead 1' via a connecting portion 10'b.

The second lead 2' includes an inner portion 20' covered by the protective package 4' and a first outer portion 21' and a second outer portion 22' each extending out of the protective package 4'. As in the first lead 1', the inner portion 10' and the two outer portions 21', 22' of the second lead 2' also extend in the plane parallel to the bottom surface 41' of the protective package 4'.

The semiconductor device B with the constitution described above is fitted into a through hole 50 formed in the circuit substrate 5 as is the semiconductor device A according to the first embodiment, and then fixed to the circuit substrate 5 via solder 53.

As has been described, each of the side surfaces 42', 43', 44', 45' of the semiconductor device B according to the second embodiment includes the upper slanted surface and the lower slanted surface (See FIG. 4.) Therefore, the semiconductor device B can be easily inserted into the through hole 50 of the circuit substrate 5. By adjusting the angle α, the size of the protective package 4', and the size of the through hole 50, it becomes possible to make easy the insertion of the protective package 4' into the through hole 50, and to reliably fit the protective package 4' into the through hole 50.

As shown in FIG. 3, the side surface 46' of the protective package 4' is formed with a cutout 46'a. The cutout 46'a is an indication of the polarity of semiconductor device B. For example, one of the two leads 1', 2' which is closer to the cutout 46' (i.e. the second lead 2' according to FIG. 3) may be predetermined to be negative. With such an arrangement as the above, the semiconductor device B can be appropriately inserted to the through hole 50 of the circuit substrate 5.

In the semiconductor device B according to the second embodiment, each of the first lead 1' and the second lead 2' has two outer portions. Therefore, the circuit substrate 5 needs a total of four connecting pads 52. However, as will be understood from FIG. 5, if the outer portion 11' of the first lead 1' is conductive to the corresponding connecting pads 52, the other outer portion 12' does not need to be conductive to its corresponding connecting pads 52. Specifically, the outer portion 12' may only be fixed mechanically to its corresponding pad 52. The same applies to the outer portions 21', 22' of the second lead 2'. By attaching the semiconductor device B to the circuit substrate 5 via the four outer portions 11', 12', 21', 22' as described above, the semiconductor device B can be mounted stably on the circuit substrate 5.

Next, a method for manufacturing the semiconductor device B having the above constitution will be described with reference to FIGS. 6–8.

Figure 6:
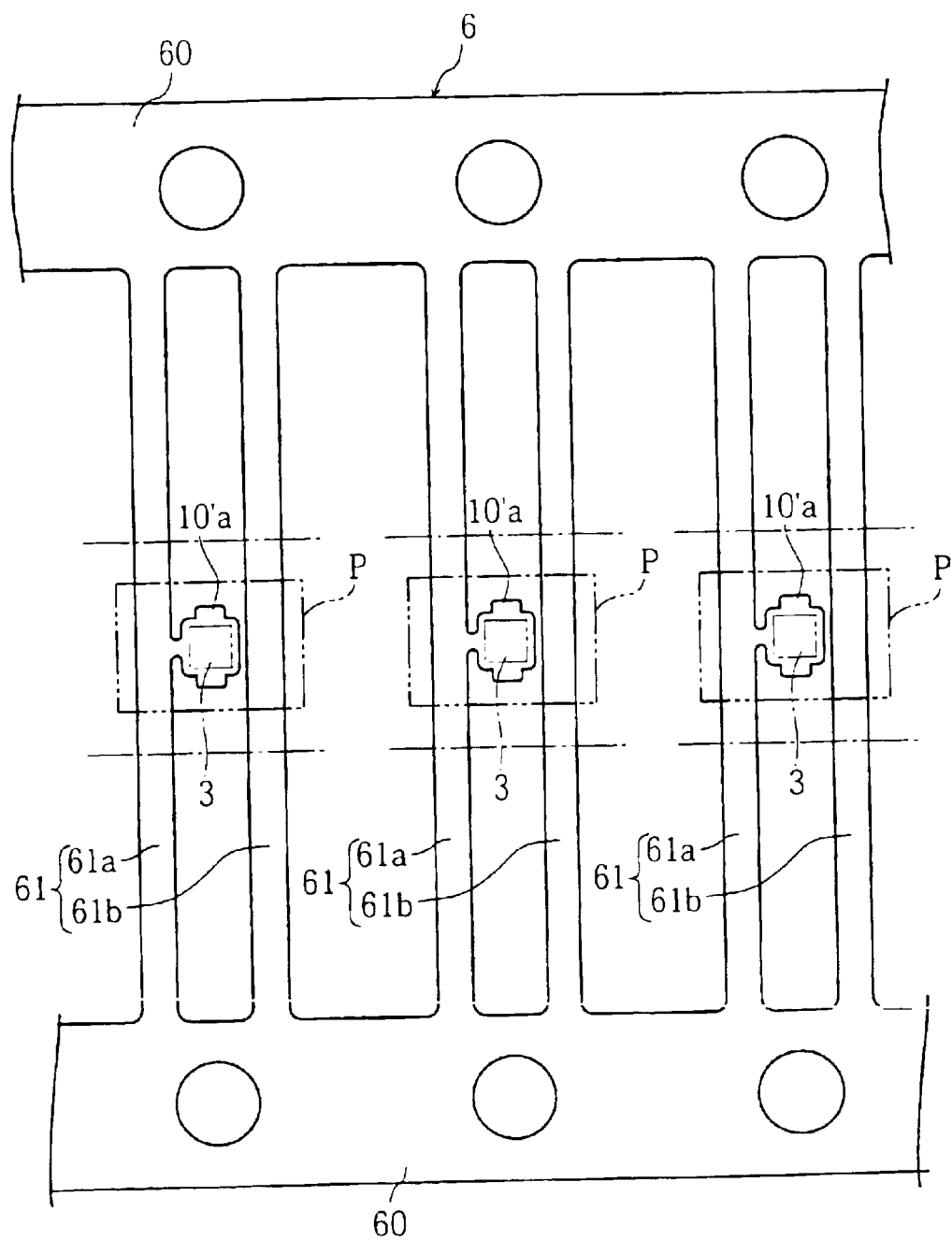
FIG. 6 is a plan view at a lead frame used for manufacture of the semiconductor device according to the present invention.

FIG. 6 is a plan view showing a lead frame used for the manufacture of the semiconductor device B. The lead frame 6 shown in the figure can be obtained by punching out a metal plate made of copper, iron and so on. The lead frame 6 includes a pair of side bars 60 extending in parallel to each other. Further, the lead frame 6 has a plurality of cross member pairs 61 interconnecting the side bars 60. The cross bar pairs 61 are disposed at an interval longitudinally of the side bars 60. Each of the cross bar pairs 61 includes a first cross bar 61a and a second cross bar 61b extending vertically, with respect to the longitudinal direction of the side bar 61. The first cross bar 61a has a center portion formed with a bonding pad 10'a.

A semiconductor chip 3 is bonded to each of the bonding pads 10'. If the semiconductor device B is constituted as a light emitting device, the semiconductor chip 3 is provided by a light emitting diode for example. If the semiconductor device B is constituted as a light receiving device, the semiconductor chip 3 is provided by a phototransistor for example. Of course, other semiconductor chips may be used.

Figure 7:
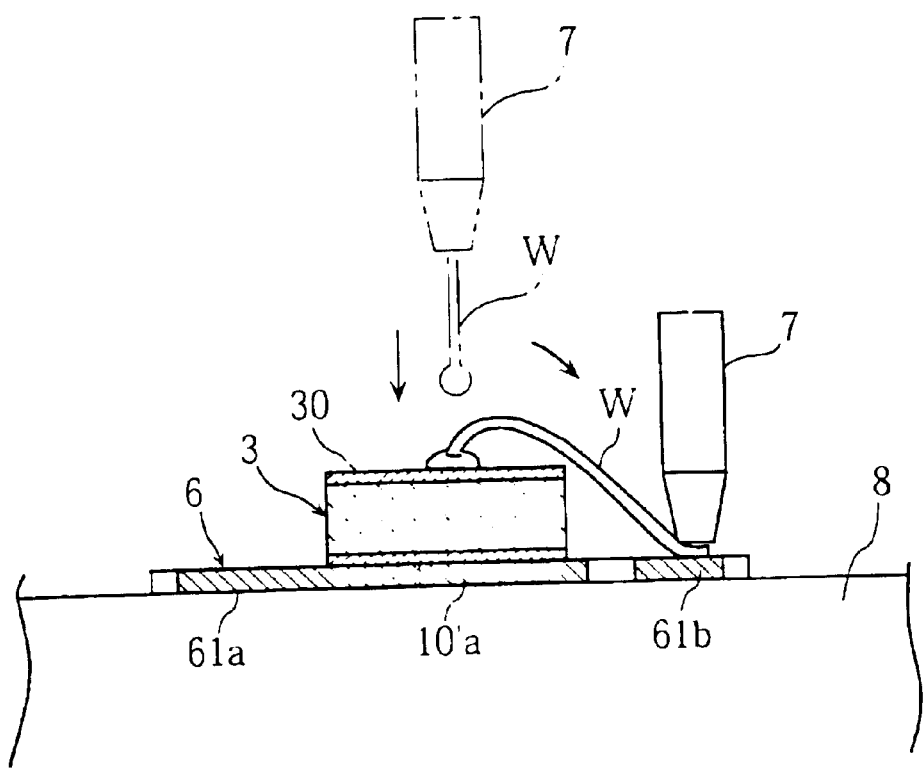
FIG. 7 is a diagram for describing a wire-bonding step.

Next, as shown in FIG. 7, an upper surface 30 of the semiconductor chip 3 and the second cross bar 61b are connected by a wire W. The connection of the wire W can be made by using a bonding tool 7 Specifically, a tip portion of the wire W is extended out of a lower end portion of the bonding tool 7. Then, the tip portion is melted into a ball of molten. Then, the bonding tool 7 is moved downward, pressing the molten ball onto the upper surface of the semiconductor chip 3 (first bonding). Thereafter, while pulling the wire W out of the lower end portion of the bonding tool 7, the bonding tool is moved to the location of the second cross bar 61b. Finally, the wire W is press-fitted to the second cross bar 61b (second bonding). In order to perform the wire bonding appropriately, the lead frame 6 should preferably be heated by a heater (not illustrated) incorporated in a supporting table 8. Alternatively, the bonding tool 7 may be supplied with ultrasonic wave when performing the second bonding.

Figure 8:
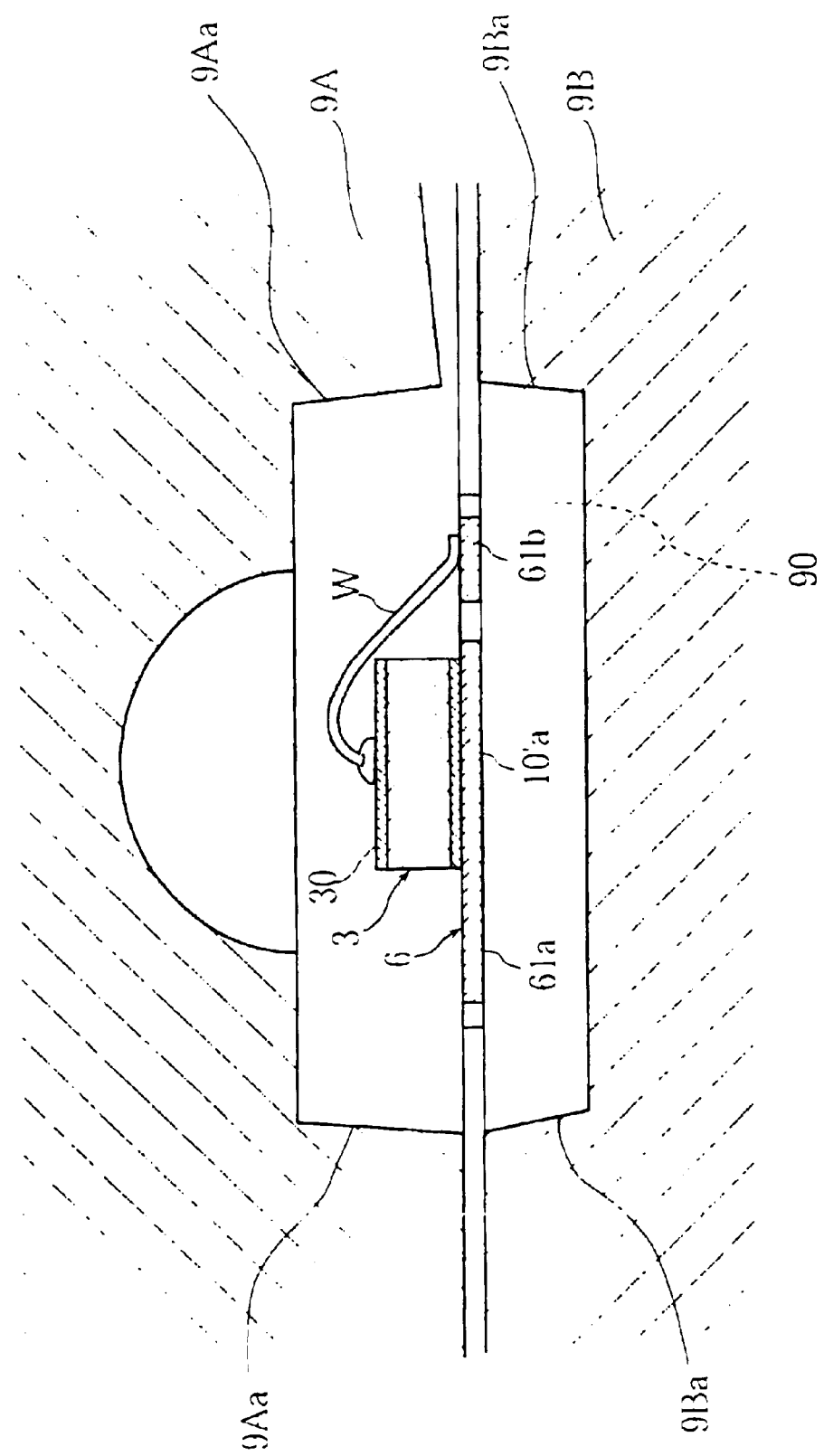
FIG. 8 is a sectional view-showing a packaging step.

Next, by using a predetermined molding apparatus, a protective package 4' is formed in a region P enclosed by phantom lines (FIG. 6) of the lead frame 6. Each of the protective package 4' is formed as follows:

First, as shown in FIG. 8, the semiconductor chip 3 is housed in a cavity 90 formed by an upper mold member 9A and a lower mold member 9B. Next, under this particular state, a molten thermosetting resin (an epoxy resin for example) is injected into the cavity 90. Finally, after the injected resin has been set, the upper mold member 9a and the lower mold member 9B are moved upward and downward respectively, to take out the solid resin, i.e. the protective package 4'. By this molding operation, the light condensing portion 44' is formed simultaneously.

As shown in FIG. 8, the upper mold member 9A has downwardly widening inner side surfaces 9Aa whereas the lower mold member 9B has upwardly widening inner side surfaces 9Ba. For this reason, when the resin set in the cavity 90 is taken out, the solid body of resin can be easily separated from the upper mold member 9A and the lower mold member 9B.

If the semiconductor device B is constituted as the light emitting device or a light receiving device, the protective package 4' is formed of a highly transparent resin (for example an epoxy resin). Otherwise, the protective package 4' may not necessarily be formed of a highly transparent resin, or it is not necessary to provide the light condensing portion 44' depending on the application.

The semiconductor device B can be constituted so as to selectively receive an infrared ray. In this case, the protective package 4' may be of a transparent material, but is preferably formed of a black resin in order to effectively prevent the reception of rays other than the infrared ray.

After the protective package 4' is formed, the first and the second cross bars 61a, 61b are cut at predetermined locations (indicated by dashed lines in FIG. 6) to obtain a finished semiconductor device B (FIG. 3). The semiconductor device B thus obtained may be mounted on the circuit substrate 5 with another semiconductor device for light reception, a photo sensor can be manufactured.

Figure 9:
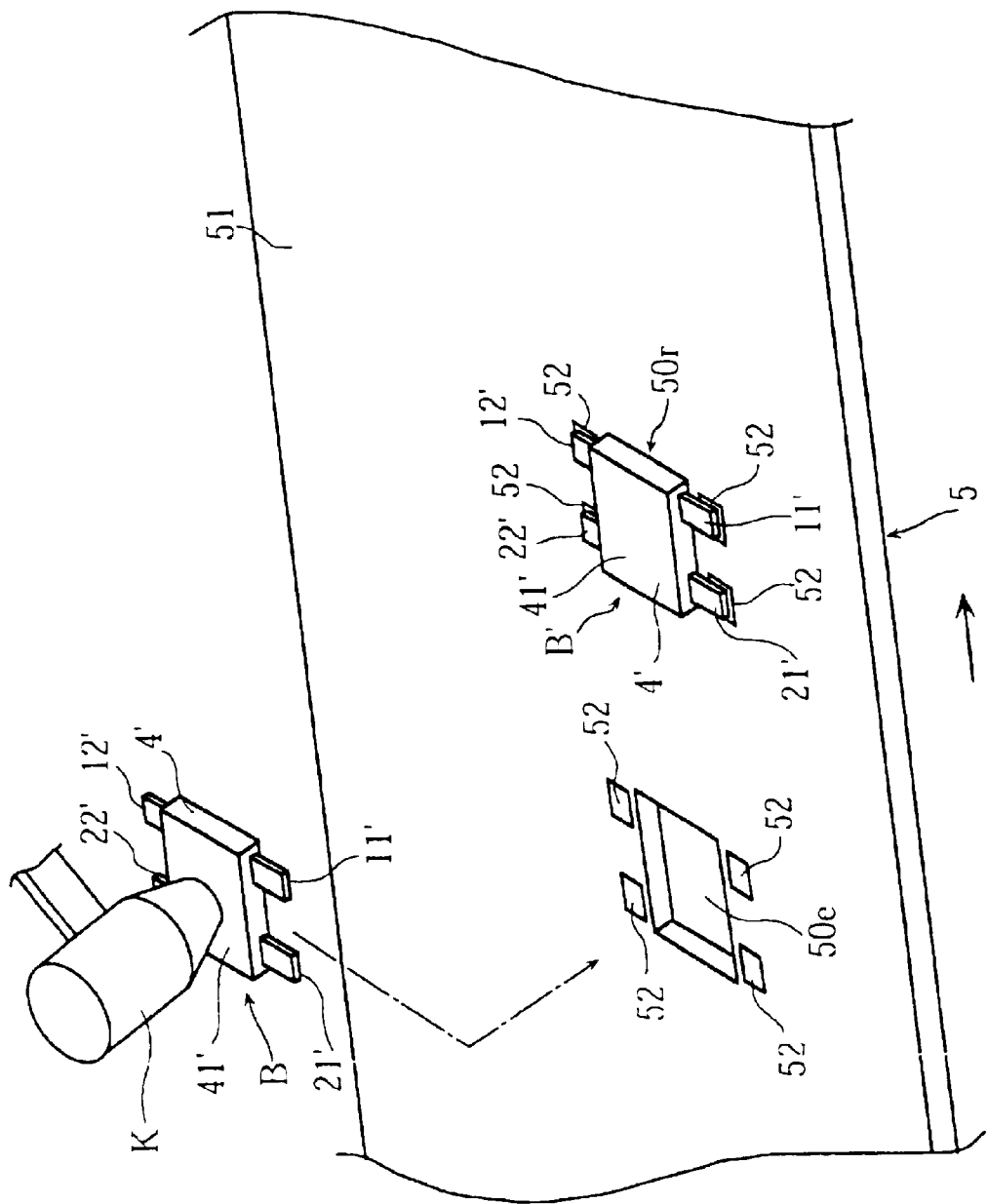
FIG. 9 is a diagram for describing a step in which the semiconductor device according to the present invention is mounted on a circuit substrate.

FIG. 9 shows a step of mounting the semiconductor device B according to the second embodiment of the present invention on the circuit substrate 5. (The circuit, substrate S shown in the figure has a light receiving semiconductor device B' already mounted.) As shown in this particular figure, the circuit substrate 5 is formed with a through hole 50e for fitting the semiconductor device B. The through hole 50e is spaced from another through hole 50r for the light receiving semiconductor device B' by a predetermined distance.

The circuit substrate 5 has a main surface 51 provided with four connecting pads 52 near the through hole 50e. These pads 52 are to be connected with the outer portions 11', 12' of the first lead 1', and the outer portions 21', 22' of the second lead 2' of the semiconductor device B.

When the semiconductor device B is fitted into the through hole 50e, a suction collet K as shown in FIG. 9 may be used. In this case, a bottom surface 41' of the semiconductor device B is sucked by the suction collet K, and then the collet K is moved toward the circuit substrate 5 to insert the semiconductor device B into the through hole 50e. (See indication by dashed lines in FIG. 9.)

After the semiconductor device B is appropriately fitted into the through hole 50e, the circuit substrate 5 mounted with the semiconductor device B (and the semiconductor device B') undergoes a heat treatment. Though not illustrated in the figure, each of the connecting pads 52 is applied with solder paste in advance. Therefore, by heat-treating the circuit substrate 5, the applied solder becomes molten, and by cooling the circuit substrate 5 thereafter, the outer portions 11', 12', 21' 22' of the first lead 1' and the second lead 2' are fixed to respective connecting pads 52.

Figure 10:
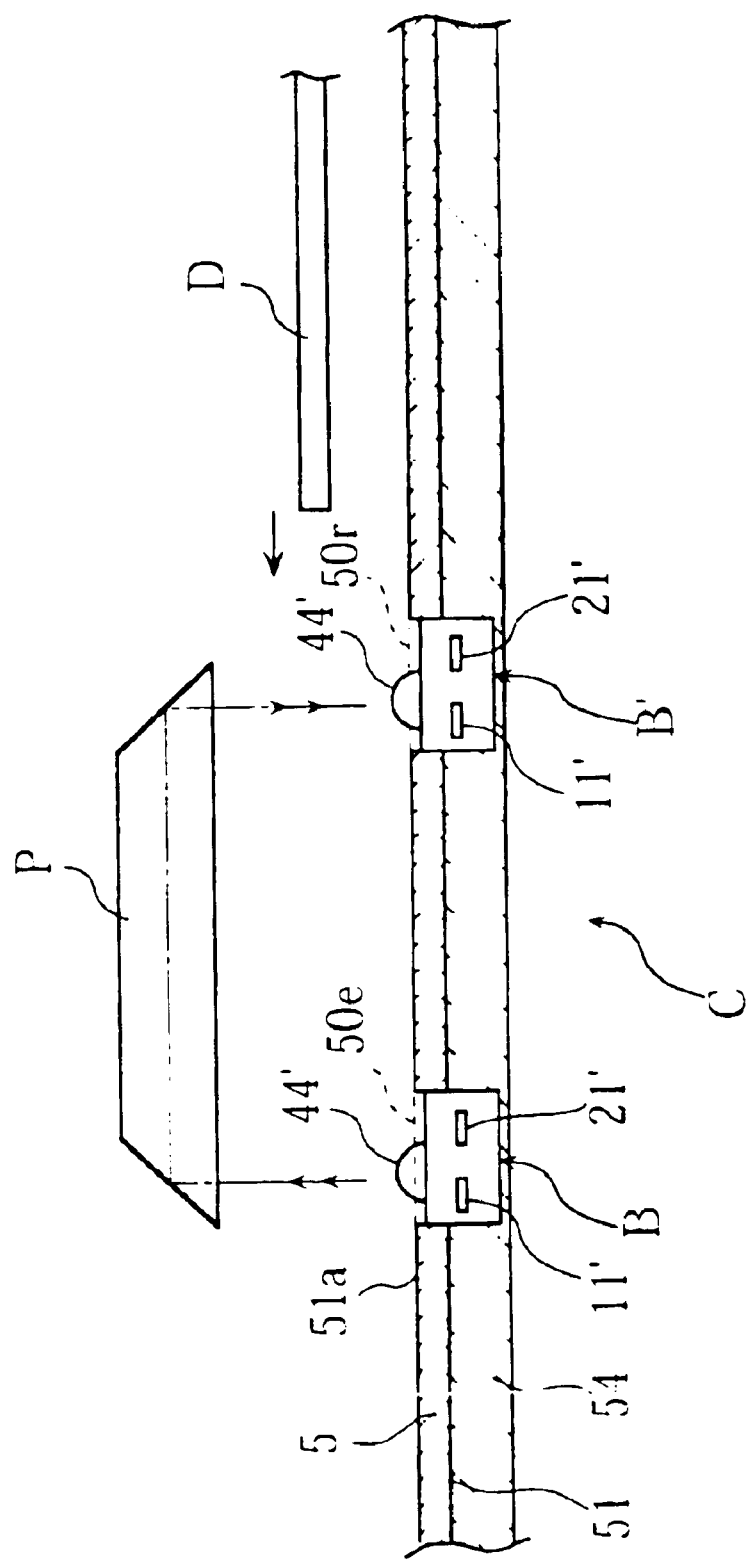
FIG. 10 a sectional view showing a use of the semiconductor device according to the present invention.

After mounting the semiconductor devices B and B' on the circuit substrate 5, as shown in FIG. 10, a coating member 53 is applied on the main surface 51 of the circuit substrate 5. As a result, the semiconductor devices B, B' are coated by the coating member 54. Through such a process as described above, a unit C including the semiconductor devices B, B' and the circuit substrate 5 is obtained. The coating member 54 is preferably provided by an electrically insulating and optically nontransparent resin for example. By using the coating member 54 provided by such a resin material, light, electrical noise and so on from outside of the unit C can be shielded.

As shown in FIG. 10, he unit C can be used in a CD player for detecting presence of a disc D. Specifically, the unit C is disposed in the CD player, so that the light condensing portions 44' of the semiconductor devices B, B' face the inserted disc D. If the disc D is absent, light emitted from the semiconductor device B advances a path indicated by dashed lines in FIG. 10, and reaches the semiconductor device B'. (The member P disposed across the path is a prism.) On the other hand, if the disc D is inserted in the CD player, the path described above is blocked by the disc D, and the light emitted from the semiconductor device B is not received by the semiconductor device B'.

Figure 21:
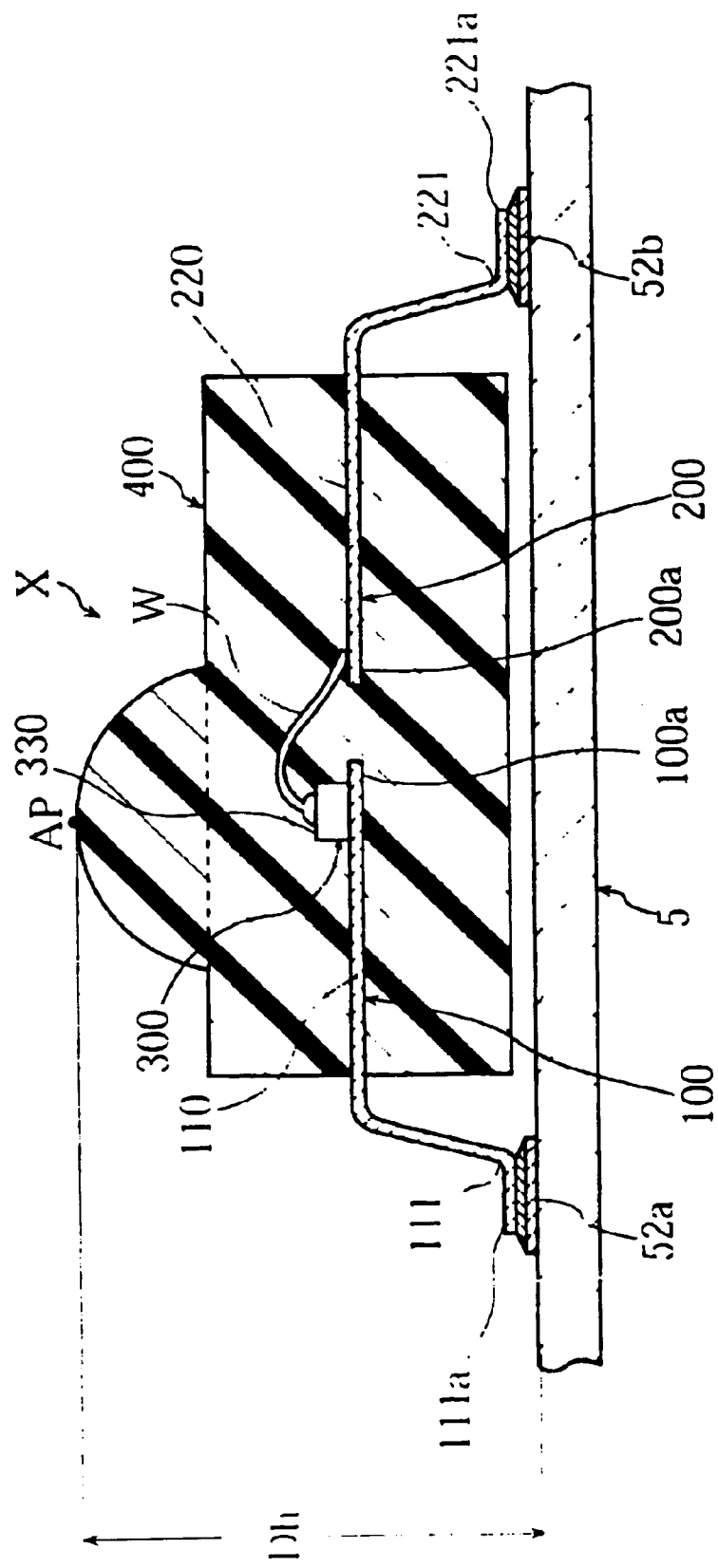
FIG. 21 is a sectional view taken in lines III—III in FIG. 20.

The above described unit C utilizing the semiconductor devices B, B' according to the present invention, can be made more compactly than a unit utilizing prior art semiconductor devices and the substrate. (See FIG. 21.) Therefore, as shown in FIG. 10, the disc D can be placed closer to the second surface 51a of the circuit substrate 5 than in the prior art. As a result, it becomes possible to decrease a detecting space for the photo sensor incorporated in the CD player.

Next, a semiconductor device according to a third embodiment of the present invention will be described with reference to FIGS. 11~13. As will be understood from FIG. 13, the semiconductor device according to the third embodiment is a photo sensor in which a light emitting semiconductor element is packaged together with a light receiving semiconductor element.

Specifically, the illustrated semiconductor device E, comprises a light emitting semiconductor chip 3, a light receiving semiconductor chip 3', and a protective package 4' covering these semiconductor chips. Further, the semiconductor device E has a generally flat first lead 1 and a second lead 2 each conducting to the semiconductor chip 3, and further has a generally flat first lead 1' and a second lead 2' each conducting to the semiconductor chip 3'. Each of the first leads 1, 1' and the second leads 2, 2' partially extends out of the protective package 4'. The protective package 4' according to the third embodiment has an outlook generally the same as the one shown in FIG. 3, differing however, in that no light condensing portion is provided, and that a cutout 46' is formed at a corner portion of the protective package 4'.

The protective package 4' has a first transparent resin portion 4'a incorporating the semiconductor chip 3, a second transparent resin portion 4'b incorporating the light receiving semiconductor chip 3' and a third, non-transparent resin portion 4'c holding the resin portions 4'a, 4'b. The first and the second resin portions 4'a, 4'b have respective upper surfaces and bottom surfaces not covered by the third resin portion 4'c and therefore exposed to outside. The first and the second resin portions 4'a, 4'b are formed of a transparent epoxy resin for example whereas the third resin portion 4'c is formed of a black resin for example.

In a side view, the semiconductor chip 3 is placed generally at a vertically central location in the first resin portion 4'a, on an inner portion 10 of the first lead 1 whereas the semiconductor chip 3' is placed at a generally central location in the second resin portion 4'b, on an inner portion 10' of the other first lead 1'. The upper surfaces of the semiconductor chips 3, 3' are electrically connected with inner portions 20, 20' of the second leads 2, 2' respectively via wires W.

Figure 13:
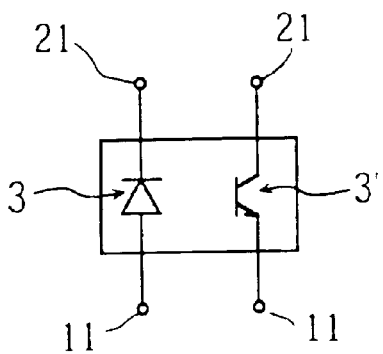
FIG. 13 is a diagram showing constituent elements of the semiconductor device.

As shown in FIG. 13, the semiconductor chip 3 can be provided by an LED whereas the semiconductor chip 3' can be provided by a phototransistor. Alternatively to the phototransistor, a photo diode may be used.

The semiconductor device E having the constitution described as above can be manufactured in the following steps to be described below.

Figure 14:
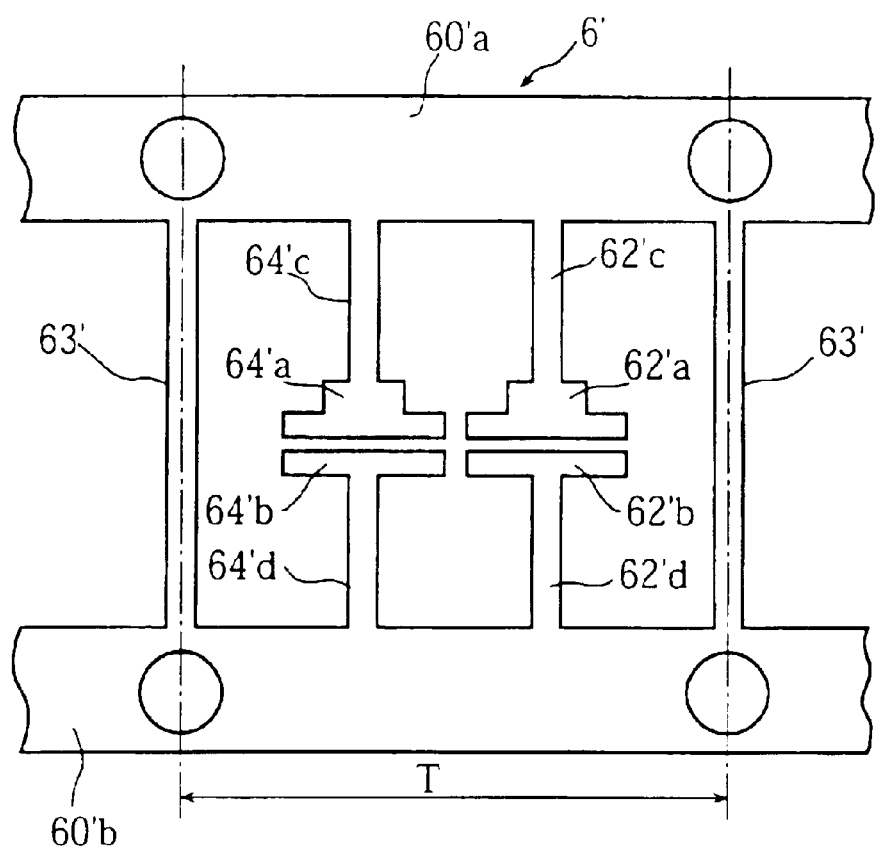
FIGS. 14–17 are diagrams for describing manufacturing steps of the semiconductor device in FIG. 11.

First, a lead frame 6' as shown in FIG. 14 is prepared by punching out a thin metal plate for example. The lead frame 6' includes a first and a second side bars 60'a, 60'b, extending in parallel to each other, and a plurality of cross bars 63' (FIG. 14 shows only two cross bars). The cross bars 63' are spaced from the adjacent ones by a predetermined interval T longitudinally of the lead side bars 60'a, 60'b.

In a region between a pair of mutually adjacent cross bars 63', a pair of lead portions 62'c, 62'd and another pair of lead portions 64'c, 64'd are disposed. The lead portions 62'c, 64'c extend from the first side bar 60'a toward the second side bar 60'b. On the other hand, the lead portions 62'd, 64'd extend from the second side bar 60'b toward the first side bar 60'a. The lead portions 62'c, 64'c have free ends formed with chip bonding portions 62'a, 64'a respectively. Further, the lead portions 62'd, 64'd have free ends formed with wire bonding portions 62'b, 64'b respectively.

Figure 15:
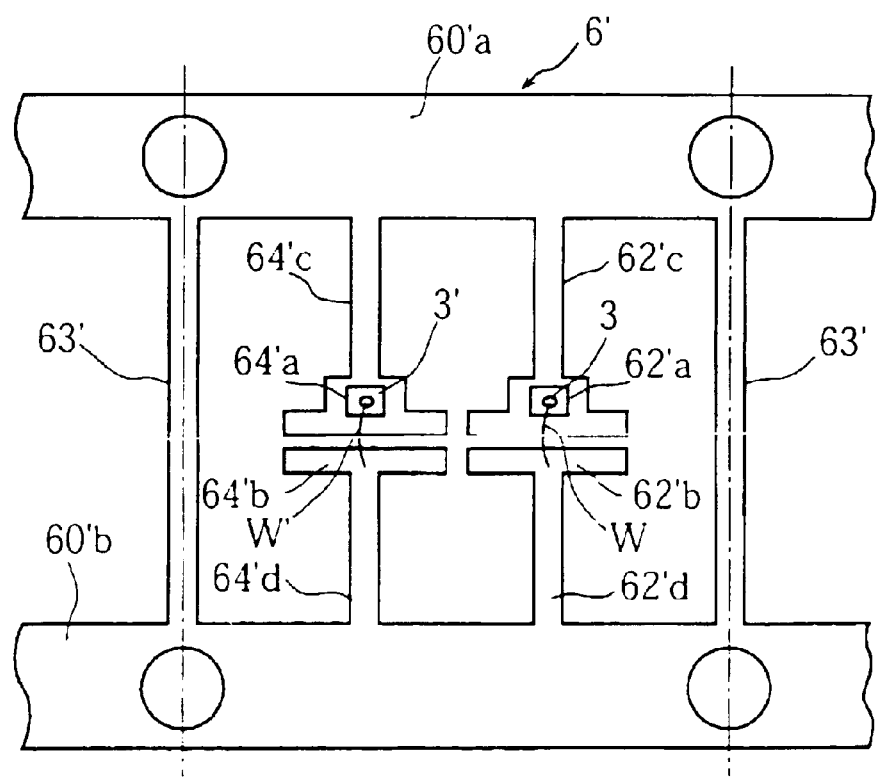

The lead frame 6' having the constitution as described above is mounted with a light emitting semiconductor chip 3 and the light receiving semiconductor chip 3'. Specifically, as shown in FIG. 15, the light emitting semiconductor chip 3 is bonded to the chip bonding portion 62'a whereas the light receiving semiconductor chip 3' is bonded to the chip bonding portion 64'a. Thereafter, the upper surface of the semiconductor chip 3 and the wire bonding portion 62'b are electrically connected by the wire W whereas the upper surface of the semiconductor chip 3' and a wire bonding portion 64'b are electrically connected by a wire W'.

Figure 16:
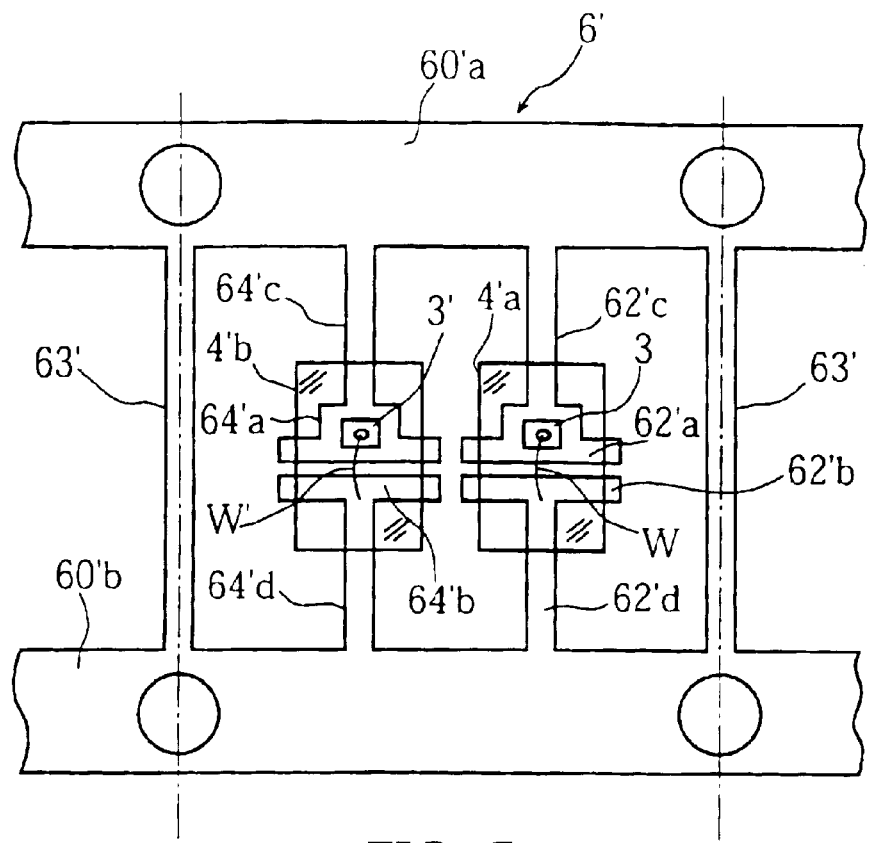

Next, as shown in FIG. 16, the semiconductor chip 3 and the wire W are molded and thereby covered by a transparent resin body 47a (hereinafter called the first resin body), and the semiconductor chip 3' and the wire W' are molded and thereby covered by another transparent resin body 4'b (hereinafter called the second resin body) (The first molding step).

Figure 17:
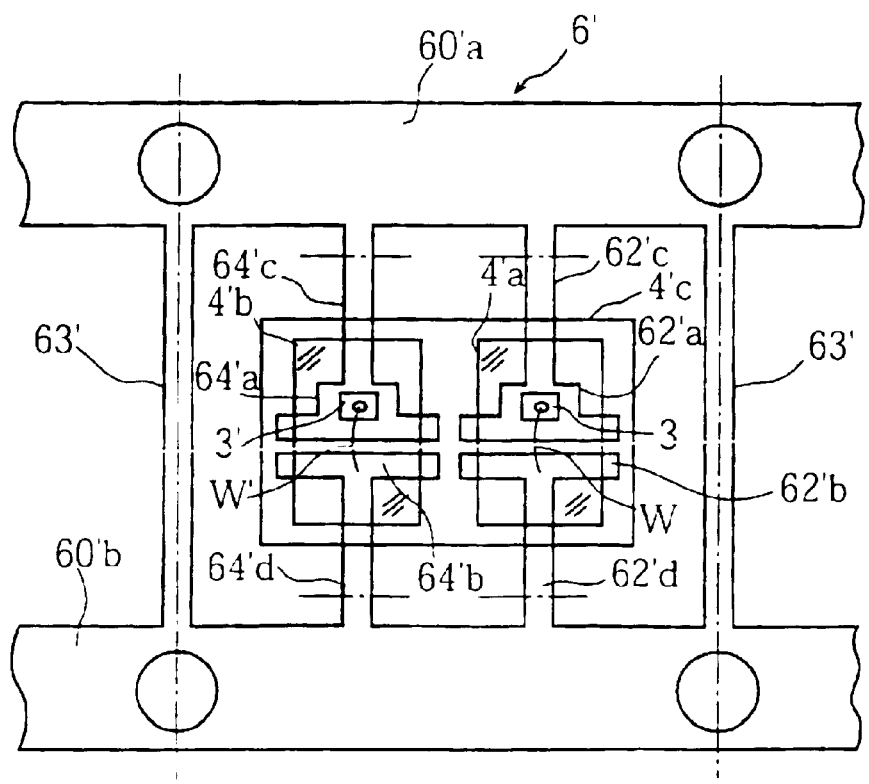

Next, as shown in FIG. 17, the first and the second resin bodies 4'a, 47b are covered by a non-transparent resin body (hereinafter called the third resin body) (The second molding step). In this step, the upper surfaces and the bottom surfaces of the first and the second resin bodies 4'a, 4'b are left exposed to outside.

Figure 11:
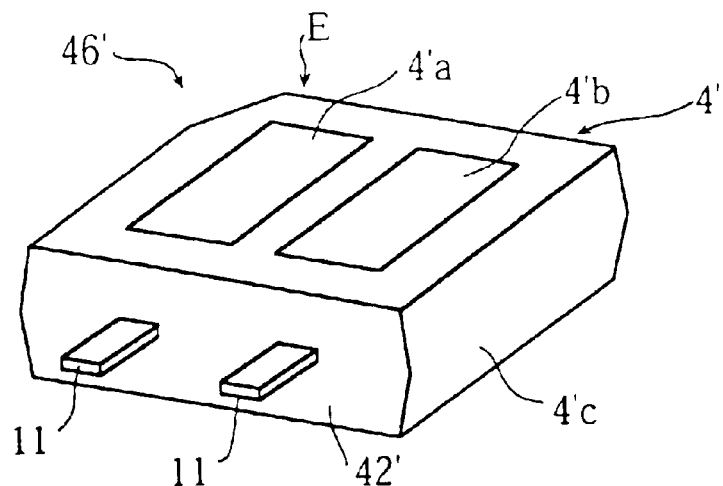
FIG. 11 a perspective view of a semiconductor device as a third embodiment of the present invention.
Figure 12:
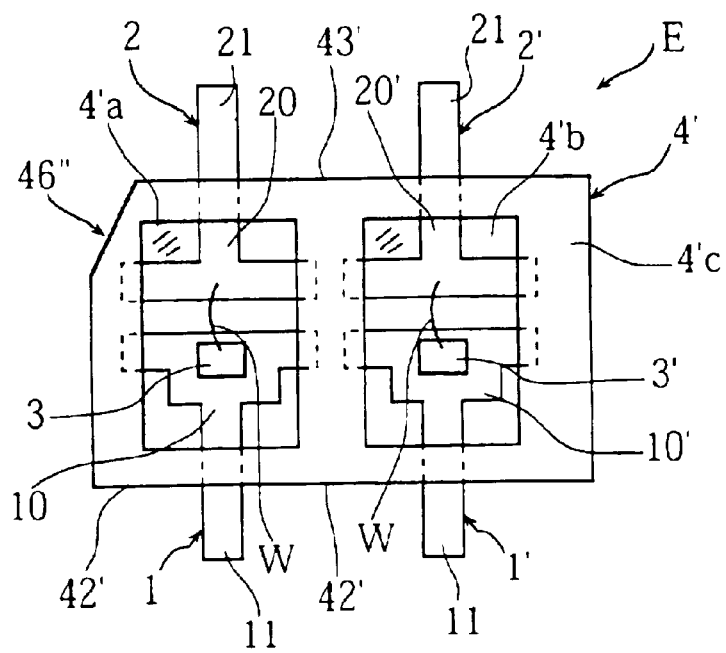
FIG. 12 a plan view of the semiconductor device in FIG. 11.

Finally, the four lead portions 62'c, 62'd, 64'c, 64'd are cut at predetermined locations (indicated by dashed lines in FIG. 17) to obtain the semiconductor device E as shown in FIG. 11. The semiconductor device E can be placed into the circuit substrate in the same state as is the semiconductor device B shown in FIG. 3.

Figure 18:
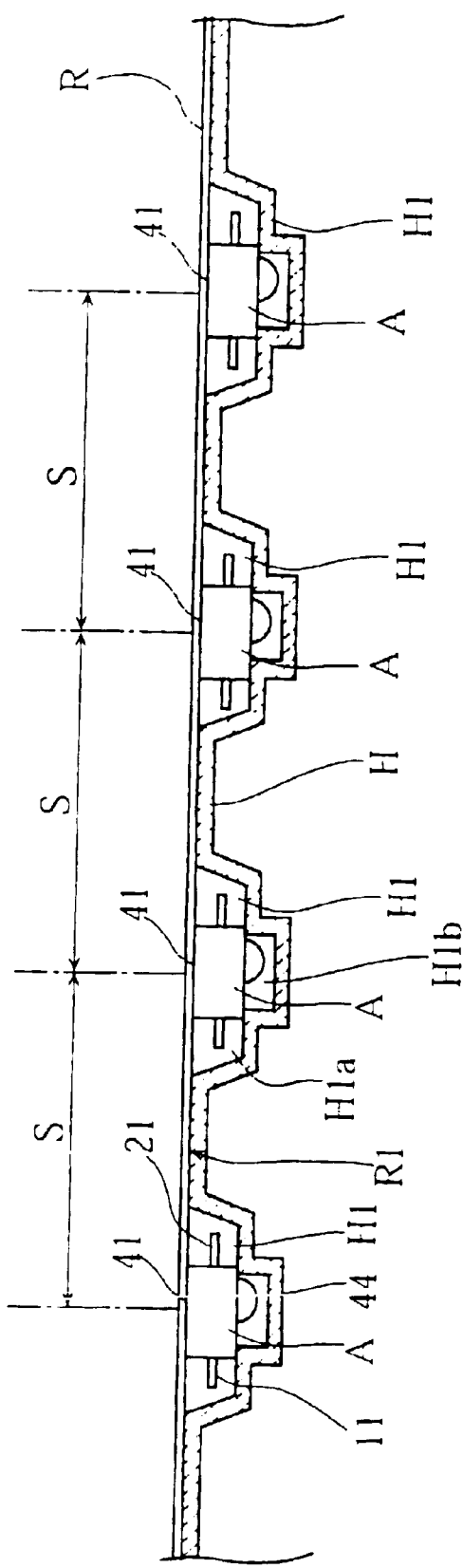
FIG. 18 is a sectional view of a storage receptacle for collectively holding a plurality of the semiconductor devices.
Figure 19:
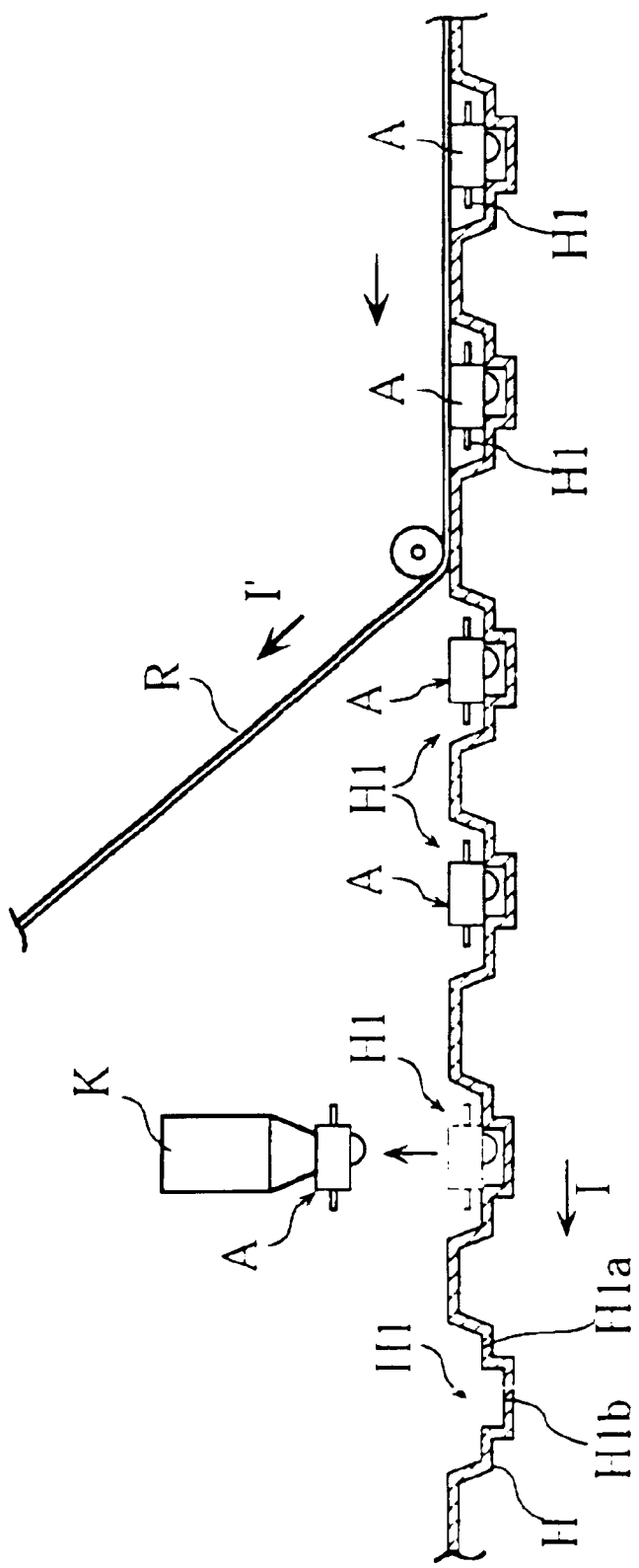
FIG. 19 is a diagram showing a state in which the semiconductor device is being taken out of the storage receptacle in FIG. 18.
Figure 20:
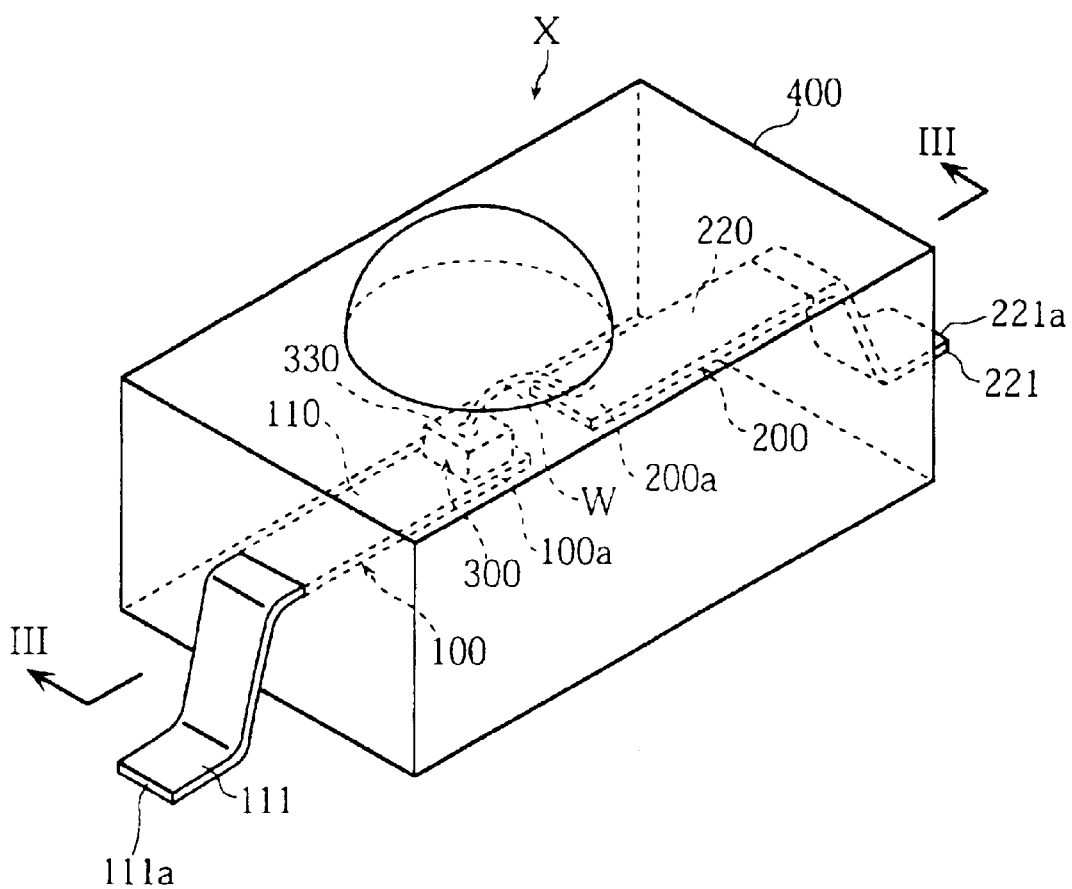
FIG. 20 is a perspective view of a prior art semiconductor device.

Next, reference is made to FIG. 18 and FIG. 19. These figures show a storage receptacle capable of collectively storing a plurality of the semiconductor devices. FIGS. 18 and 19 show the semiconductor devices A according to the first embodiment. However, the storage receptacle can also be used to store the other semiconductor devices such as the conductor device B and the conductor device E.

As shown in FIG. 18, the storage receptacle includes a carrier member H having a plurality of recesses H1, and a cover tape R pasted to the carrier member H to close the recesses H1; The recesses H1 are formed at a predetermined longitudinal interval S. The cover tape R has a adhesive surface R1 to contact the carrier member H and can be peeled off the carrier member H as necessary (See FIG. 19).

As shown in FIG. 18, each semiconductor device A is housed in a corresponding recess H1, with the bottom surface 41 facing upward. In order to accommodate the entire semiconductor device A appropriately while avoiding interference with the light condensing portion 44, each recess H1 includes an upper space H1a having a larger area of section and a lower space H1b having a smaller area of section. The light condensing portion 44 is housed in the lower space H1b. The carrier member H having the constitution as described above may be formed by embossing an oblong member made of a plastic for example.

For automatically storing a plurality of the semiconductor devices A into the recesses H1, a suction collet operated under a computer control may be used for example. After a predetermined number of the semiconductor devices A are placed appropriately, the cover tape R is pasted to the carrier member H to close each of the recesses. This operation can also be automated.

Each of the semiconductor devices placed in the carrier member H and covered by the cover tape R can be taken out of the storage receptacle in the following steps.

Specifically, referring to FIG. 19, first the cover tape R (See FIG. 18.) pasted to the carrier member H is gradually removed by appropriate means. During this operation, the carrier member H is moved in a direction indicated by Arrow I. On the other hand, the removed cover tape R is moved in a direction indicated by Arrow I' and wound by an unillustrated winding device. This gradually exposes the semiconductor devices A in the recesses H1 of the carrier member H. The exposed semiconductor device A is sucked by a suction collet K disposed at an appropriate location, and then taken up. In such steps as described above, the semiconductor devices A are taken out of the recesses H, one by one.

According to the method described as above, the semiconductor devices A stored in the storage receptacle can be automatically taken out. Further, after taking out a necessary number of semiconductor devices A, if the remaining cover tape R is left attached to the carrier member H, then the remaining semiconductor devices A can be stored unexposed to the outside air. The carrier member shown in FIGS. 18 and 19 is an oblong member. However, the shape of the carrier member H is not limited to this. For example, the recesses H1 for accommodating the semiconductor devices may be provided in a two-dimensional layout in a plate-like container.

What is claimed is:

1. A mounting structure of a semiconductor device on a circuit substrate, the semiconductor device including: a semiconductor chip; a protective package for covering the semiconductor chip, including at least a pair of opposed side surfaces, each of the side surfaces having a first slanted portion and a second slanted portion each being flat and meeting the other at a predetermined angle; a first lead conducting to the semiconductor chip, including an inner portion covered by the protective package and a plurality of outer portions extending out of the protective package; a second lead conducting to the semiconductor chip, including an inner portion covered by the protective package and a plurality of outer portions extending out of the protective package; the inner portions and the outer portions of the first and the second leads being flat and extending in a same plane; the outer portions of the first lead extending from both of the pair of opposed side surfaces out of the protective package; the outer portions of the second lead extending from both of the opposed side surfaces out of the protective package;

the circuit substrate including: a first surface formed with a predetermined wiring pattern; a second surface opposite to and spaced from the first surface thickness wise of the circuit substrate; a plurality of connecting pads formed in the first surface; and a through hole corresponding to a shape of the protective package;

wherein the protective package is fitted into the through hole of the substrate while partially protecting beyond both of the first and second surfaces of the substrate thickness wise thereof, the outer portions of the first lead and the second lead being connected with the connecting pads.

2. The mounting structure according to claim 1, wherein the connecting pads are disposed around the through hole.

3. The mounting structure according to claim 1, wherein the first surface mounted with the semiconductor device is laminated with a coating member.

* * * * *